United States Patent [19]

Kim

[11] Patent Number: 5,534,459
[45] Date of Patent: Jul. 9, 1996

[54] METHOD FOR FORMING SILICON ON INSULATOR STRUCTURED

[75] Inventor: Sung S. Kim, Daeku-si, Rep. of Korea

[73] Assignee: LG Semicon Co., Ltd., Seoul, Rep. of Korea

[21] Appl. No.: 482,002

[22] Filed: Jun. 7, 1995

[30] Foreign Application Priority Data

Jun. 17, 1994 [KR] Rep. of Korea .................. 13740/1994

[51] Int. Cl.$^6$ .................................................. H01L 21/20
[52] U.S. Cl. .............................. 437/89; 437/59; 437/86; 437/90; 437/915
[58] Field of Search ................................. 437/59, 86, 89, 437/90

[56] References Cited

U.S. PATENT DOCUMENTS

| | | | |
|---|---|---|---|
| 5,141,881 | 8/1992 | Takeda et al. | 437/59 |
| 5,185,286 | 2/1993 | Eguchi | 437/89 |
| 5,258,318 | 11/1993 | Buti et al. | 437/90 |
| 5,279,989 | 1/1994 | Kim | 437/59 |
| 5,358,881 | 10/1994 | Packwood | 437/90 |
| 5,470,766 | 11/1995 | Lien | 437/59 |
| 5,476,800 | 12/1995 | Burton et al. | 437/59 |

Primary Examiner—R. Bruce Breneman
Assistant Examiner—Ramamohan Rao
Attorney, Agent, or Firm—Morgan, Lewis and Bockius

[57] ABSTRACT

Method for forming an SOI (Silicon On Insulator) structured substrate comprising the steps of forming a first insulation film on a silicon substrate, selectively exposing the substrate by selectively removing the first insulation film, forming high density impurity regions in the substrate by injecting high density impurity ions into the exposed substrate wherefrom the first insulation film has been removed, forming a first epitaxial layer on the surface of the first insulation film and the high density impurity regions, removing a portion of the first epitaxial layer on each of the high density impurity regions, forming a second insulation film on the first epitaxial layer, forming an insulation layer including the first insulation film and the second insulation film on the substrate by etching the second insulation film to expose the first epitaxial layer, and growing a second epitaxial layer on the surface of the insulation layer.

5 Claims, 3 Drawing Sheets

METHOD FOR FORMING SILICON ON INSULATOR STRUCTURED

BACKGROUND OF THE INVENTION

1. Field of the Invention

This invention relates to a semiconductor device, and more particularly to a method for forming an SOI(Silicon On Insulator) structured substrate suitable for a high speed device.

2. Discussion of the Related Art

Conventional methods for forming an SOI structured substrate such as, the SIMOX(Silicon Implanted Oxygen), SDB(Silicon Direct Bonding), and recrystallization by a strip heater are known widely.

The SIMOX method involves forming the SOI structured substrate by forming an oxide film on a surface of a silicon substrate with high energy injection of oxygen ions into the silicon substrate. The oxygen ions are coupled with the silicon ions upon heating them at a high temperature.

The SDB method involves forming the SOI structured substrate by bonding a silicon substrate on another silicon substrate on which an oxide film has been formed. This surface has been polished such that it has no dangling bonding.

The recrystallization by a strip heater method involves forming the SOI structured substrate by recrystallizing a polycrystalline silicon film into a single silicon, crystal. In this method, the polycrystalline silicon film is deposited on an oxide film formed on a silicon substrate which has been melted starting at a side thereof scanned by a halogen lamp.

However, the foregoing methods have the following problems.

Due to the high energy injection of oxygen ions into the silicon substrate, the SIMOX method damages the surface of the silicon substrate and consequently degrades the properties of the interface between the silicon substrate and the oxide film. Due to bonding of the two substrates, the SDB method has problems of being liable to form voids at the bond between the two substrates, and of having to polish the substrate many times after the bonding of the substrates. The recrystallization by a strip heater method has a problem of poor crystallization due to recrystallization into a single crystal after melting the polycrystalline silicon film.

SUMMARY OF THE INVENTION

The object of this invention is to provide a method for forming an SOI structured substrate suitable for a high speed device using simple processes.

These and other objects and features of this invention can be achieved by providing a method for forming an SOI(Silicon On Insulator) structured substrate including processes for forming a first insulation film on a silicon substrate, selective exposition of the substrate by selective removal of the first insulation film, forming high density impurity regions in the substrate by injecting high density impurity ions into the exposed substrate wherefrom the first insulation film has been removed, forming a first epitaxial layer on all over the surface thereof, removing a part of the first epitaxial layer on each of the high density impurity regions, forming a second insulation film on the first epitaxial layer, forming an insulation layer made up of the first insulation film and the second insulation film on the substrate by etching the second insulation film to expose the first epitaxial layer, and growing a second epitaxial layer on all over the surface thereof.

DETAILED DESCRIPTION OF THE INVENTION

FIGS. 1A–1F are sectional illustrations of processes for forming an SOI structured substrate in accordance with an embodiment of this invention.

Figure 1A:
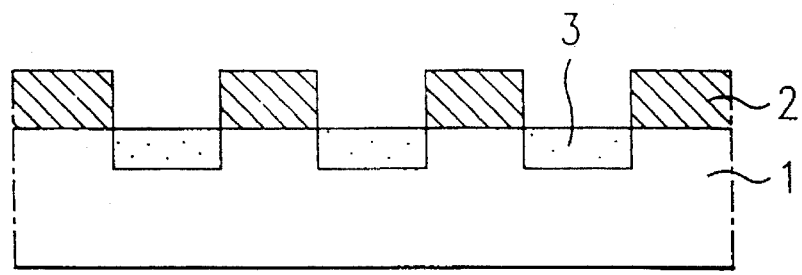
FIGS. 1A–1F are sectional illustrations of processes for forming an SOI structured substrate in accordance with an embodiment of this invention.

As shown in FIG. 1A, a first oxide film 2 is formed on a silicon substrate parts of the substrate 1 where $n^+$-type impurities are to be injected thereto are exposed by removing the first oxide film 2 from those parts using photolithography with a mask having a predetermined pattern. For example, the first oxide film 2 is subjected to etching in a zigzag form using a checker patterned mask. The first $n^+$-type impurity regions 3 are formed in the substrate by injecting $n^+$-type impurity ions into the exposed parts of the substrate 1 with the first oxide film 2 used as a mask.

Figure 1B:
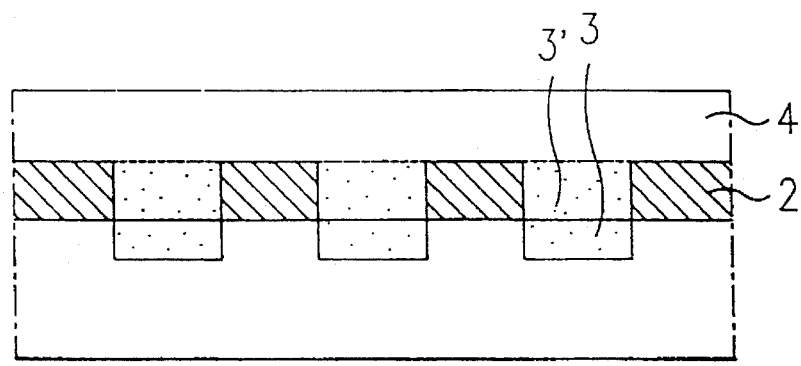

As shown in FIG. 1B, an epitaxial layer 4 is grown on the surface thereof. While growing the epitaxial layer, an out diffusion of $n^+$-type impurities from the first $n^+$-type impurity regions 3 to parts of the epitaxial layer growing on the exposed first $n^+$-type impurity regions 3 between the first oxide films occurs. Therefore, second $n^+$-type impurity regions 3' are formed in the parts of the epitaxial layer 4 between the first oxide films 2.

Figure 1C:
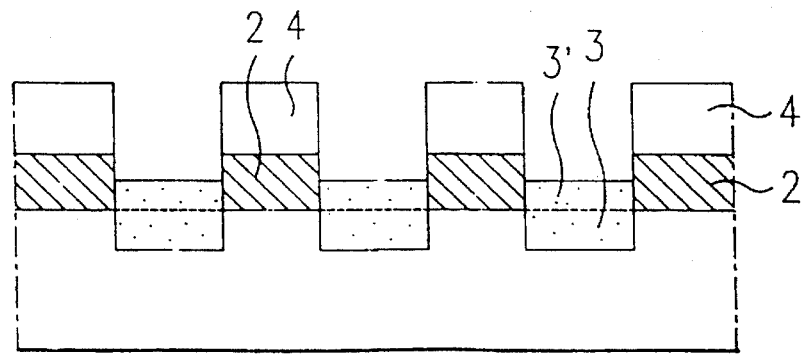

As shown in FIG. 1C, the $n^+$-type impurity regions 3' between the first oxide films 2 are exposed by subjecting the epitaxial layer 4 to trench etching using a mask having an opposite pattern to the pattern used in the process of FIG. 1A. During the etching of the epitaxial layer 4, a part of each of the second $n^+$-type impurity regions 3' is etched.

Herein, if a mask is used having a pattern identical to the pattern of the mask used in the process of FIG. 1A, a type of photoresist different from the photoresist used in the process of FIG.1A should be used. That is, if a positive type photoresist is used in the etching process of the FIG. 1A, a negative type photoresist is used in the etching process of the FIG. 1C, and vice versa.

Figure 1D:
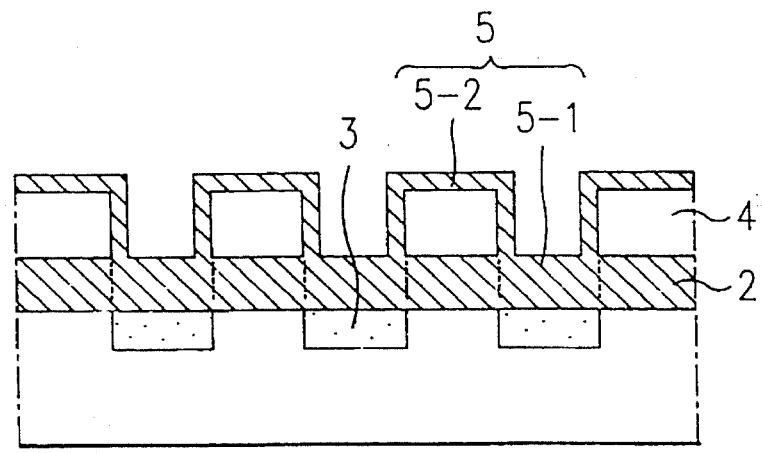

As shown in FIG. 1D, by performing an oxidation process, a second oxide film 5 is formed over the entire surface. In this step, parts of the second oxide film 5-1 on the first $n^+$-type impurity regions 3 between the first oxide films 2 are formed thicker to match the thickness of first oxide films 2. Parts of the second oxide film 5-2 on the surface of the epitaxial layer 4 are formed relatively thinner.

Figure 1E:
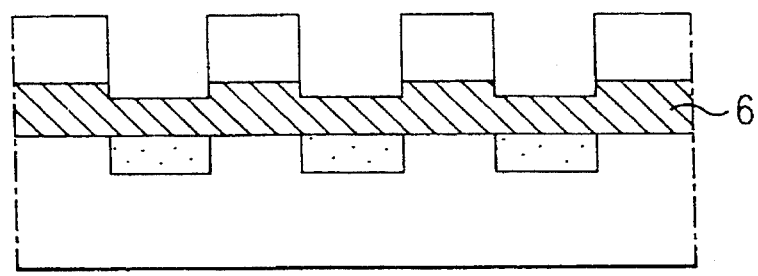

As shown in FIG. 1E, the second oxide film 5 is etched to expose the entire surface of the epitaxial layer 4. In this step, a part of each of the second oxide films 2 between the first oxide film 2 is also etched, forming a recessed insulation layer 6 on the silicon substrate 1.

Figure 1F:
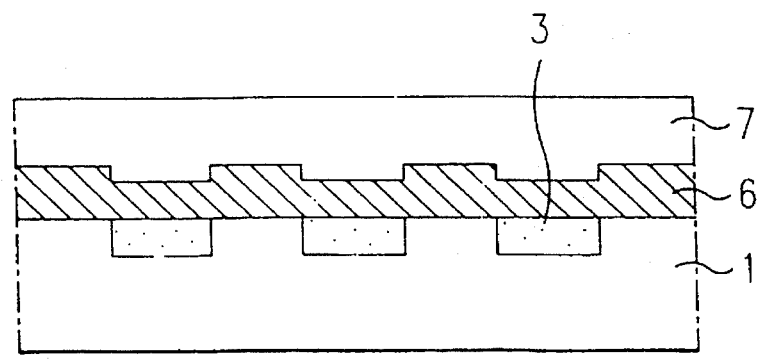

As shown in FIG. 1F, the SOI structured substrate is finally obtained by growing an epitaxial layer 7 on the recessed insulation layer 6.

Figure 2:
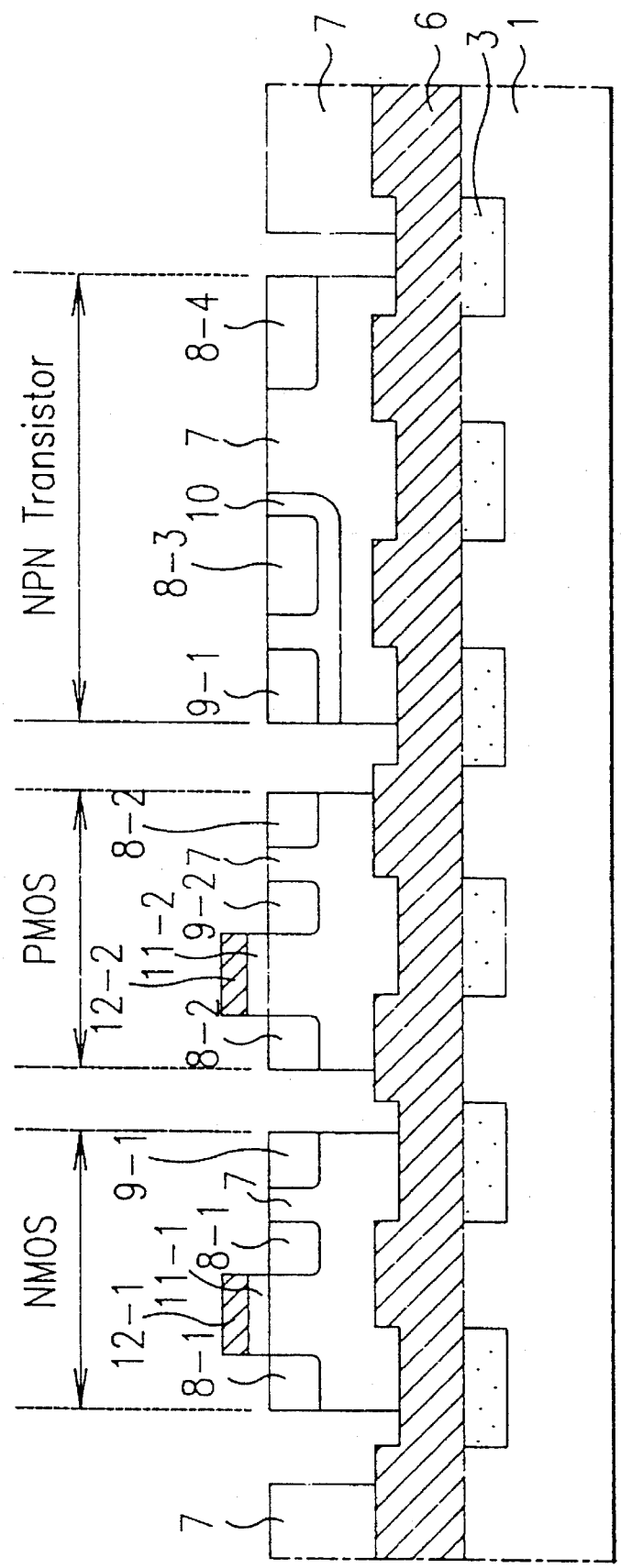
FIG. 2 is a sectional illustration of a semiconductor substrate which has utilized the SOI structured substrate in FIG. 1F.

FIG. 2 is a sectional illustration of a Bi-CMOS transistor utilizing the SOI structured substrate of this invention.

In case a CMOS element is embodied using an SOI structured substrate of this invention, though the operation is almost the same with an existing PMOS transistor and NMOS transistor, since the PMOS transistor and the NMOS transistor of this invention are separated completely from each other as shown in FIG. 2, interaction between the PMOS transistor and the NMOS transistor does not occur at all. If a bipolar element is embodied, leakage current also does not flow at all since all of the elements are formed separated from one another. The reference numbers in FIG. 2 correspond to the reference numbers of FIGS. 1A–1F for the corresponding regions. 8-1, 8-2, 8-3, and 8-4. Specifically, the reference numbers 8-1, 8-2, 8-3, and 8-4 represent $n^+$-type diffusion regions, wherein the reference numbers 8-1 act as source/drain regions of the NMOS transistor, the reference numbers 8-2 act as channel stop regions of the PMOS transistor, and the reference numbers 8-3 and 8-4 act as a collector region and an emitter region of the NPN transistor, respectively. The reference numbers 9-1 and 9-2 represent $p^+$-type diffusion regions, wherein the reference numbers 9-1 act as channel stop region and the reference number 9-2 acts as source/drain regions of the PMOS transistor. The reference number 10, being a p type diffusion region, acts as a base region of the NPN transistor. The reference numbers 11-1 and 11-2 represent thin oxide films, wherein the reference number 11-1 acts as a gate insulation film of the NMOS transistor and the reference number 11-2 acts as a gate insulation film of the PMOS transistor. The reference numbers 12-1 and 12-2 represent thin oxide films, wherein the reference number 12-1 acts as a gate of the NMOS transistor and the reference number 12-2 acts as a gate of the PMOS transistor.

As has been explained, this invention allows the formation of an SOI structured substrate with a comparatively simple process involving the growth of only two epitaxial layers with a single mask. If a CMOS is embodied utilizing the present SOI structured substrate, since the PMOS transistor and the NMOS transistor are completely separated, defects from interaction, such as latch up can be completely eliminated.

When a bipolar transistor is embodied, since the leakage current flowing through the substrate can be completely prevented, the operation speed of the element can be improved.

Furthermore, when elements of CMOS, bipolar, and BIMOS are embodied utilizing the present SOI structured substrate, since the operation speed of the element can be substantially improved over the case when an existing wafer is used as the substrate, application of this invention to a high speed element is possible.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A method for forming an SOI (Silicon On Insulator) structured substrate comprising the steps of:

forming a first insulation film on a silicon substrate;

selectively exposing the substrate by selectively removing the first insulation film;

forming first high density impurity regions in the substrate by injecting high density impurity ions into the exposed substrate wherefrom the first insulation film has been removed;

forming a first epitaxial layer on the surface of the first insulation film and the first high density impurity regions;

removing a portion of the first epitaxial layer on each of the first high density impurity regions;

forming a second insulation film on the first epitaxial layer;

forming an insulation layer including the first insulation film and the second insulation film on the substrate by etching the second insulation film to expose the first epitaxial layer; and, growing a second epitaxial layer on the surface of the insulation layer.

2. The method as claimed in claim 1, wherein the first high density impurity regions are either $n^+$-type or $p^+$-type impurity regions.

3. The method as claimed in claim 1, wherein during the step of forming the first epitaxial layer, second high density impurity regions are formed in portions of the first epitaxial layer on the first high density impurity regions by out diffusion of impurities from the first high density impurity regions to the portions of the first epitaxial layer.

4. The method as claimed in claim 1, wherein the step of forming the second insulation film includes the step of forming the second insulation film thicker on the first high density impurity regions than on the first epitaxial layers.

5. The method as claimed in claim 1, wherein the step of forming the insulation layer includes the step of etching the second insulation film so that the second insulation film is thinner than the first insulation film.

\* \* \* \* \*

UNITED STATES PATENT AND TRADEMARK OFFICE
CERTIFICATE OF CORRECTION

PATENT NO. : 5,534,459
DATED : July 9, 1996
INVENTOR(S) : Sung S. Kim

It is certified that error appears in the above-indentified patent and that said Letters Patent is hereby corrected as shown below:

On the title page: Item [54] and Column 1, line 1,
"STRUCTURED" should read --STRUCTURED SUBSTRATE --.

Signed and Sealed this

Twenty-second Day of July, 1997

Attest:

BRUCE LEHMAN

Attesting Officer

Commissioner of Patents and Trademarks